(12) United States Patent
Johnson et al.

(10) Patent No.: US 7,019,522 B1
(45) Date of Patent: Mar. 28, 2006

(54) APPARATUS FOR MEASURING THE MAGNETIC FIELD PRODUCED BY AN INSERTION DEVICE

(75) Inventors: Eric Arthur Johnson, Greene, NY (US); Joseph Duane Kulesza, Binghamton, NY (US)

(73) Assignee: Advanced Design Consulting USA, Lansing, NY (US)

( * ) Notice: Subject to any disclaimer, the term of this patent is extended or adjusted under 35 U.S.C. 154(b) by 208 days.

(21) Appl. No.: 10/763,460

(22) Filed: Jan. 23, 2004

(51) Int. Cl.
*G01R 33/00* (2006.01)

(52) U.S. Cl. .................................................. 324/260

(58) Field of Classification Search ................ 324/244, 324/247, 251, 260, 261, 262; 315/4, 5, 5.35, 315/501–507; 359/335
See application file for complete search history.

(56) References Cited

U.S. PATENT DOCUMENTS

| 4,767,988 | A | * | 8/1988 | Wilson ....................... 324/247 |
| 5,433,110 | A | * | 7/1995 | Gertz et al. ............... 73/514.35 |
| 5,483,077 | A | * | 1/1996 | Glavish .................... 250/492.2 |
| 5,629,622 | A | * | 5/1997 | Scampini ................... 324/247 |

FOREIGN PATENT DOCUMENTS

| FR | 2662812 | * | 12/1991 |
| JP | 404020000 | * | 1/1992 |
| JP | 02190711 | * | 3/1992 |
| JP | 404190598 | * | 7/1992 |
| JP | 07139902 | * | 6/1995 |
| WO | WO2004/003585 | * | 1/2004 |

OTHER PUBLICATIONS

T.C. Fan et al., Magnetic Field Measurements on Superconducting Multipole Wiggler With Narrow Duct, 2003 Proceedings of hte 2003 Particle Acclerator Conference, pp. 1047-1049.*

C.S. Hwang et al., A PC-Based Real-Time Hall Probe Automatic Measurement System for Magnetic Fields, 1999, IEEE Transactions on Instrumentation and Measurement, vol. 8, No. 4, pp. 858-863.*

Oxford Danfysik (2004). S06: Beamline Optical Design in Synchrotron Components Catalogue 2004. pp. 58-59. Oxford, UK.

* cited by examiner

*Primary Examiner*—Bot Ledynh
*Assistant Examiner*—Kenneth Whittington
(74) *Attorney, Agent, or Firm*—Anne M. Schneiderman

(57) ABSTRACT

The invention provides an apparatus for measuring the magnetic field strength between the magnet arrays of an insertion device in an X-ray generating system comprising a magnetic field strength sensor that produces an output signal, three stages for positioning the sensor along the X, Y and Z axes of the insertion device, means for controlling positions of the stages and information storage means for reading the output signal operably connected to the sensor. The apparatus eliminates the need for a dedicated measurement facility by mounting guide means for the long (Z-)axis directly to the insertion device. This long-axis guide means can be permanently or temporarily mounted to the insertion device. The remainder of the measurement apparatus may then be transferred onto the long-axis guide means while measurements and, if necessary, adjustments are made. The apparatus is compact, allowing greater access to magnet arrays for adjustment than existing systems.

24 Claims, 9 Drawing Sheets

APPARATUS FOR MEASURING THE MAGNETIC FIELD PRODUCED BY AN INSERTION DEVICE

CROSS-REFERENCE TO RELATED APPLICATIONS

Not applicable

STATEMENT REGARDING FEDERALLY SPONSORED RESEARCH OR DEVELOPMENT

Not applicable

REFERENCE TO APPENDIX

Not applicable

1. TECHNICAL FIELD

Figure 1:
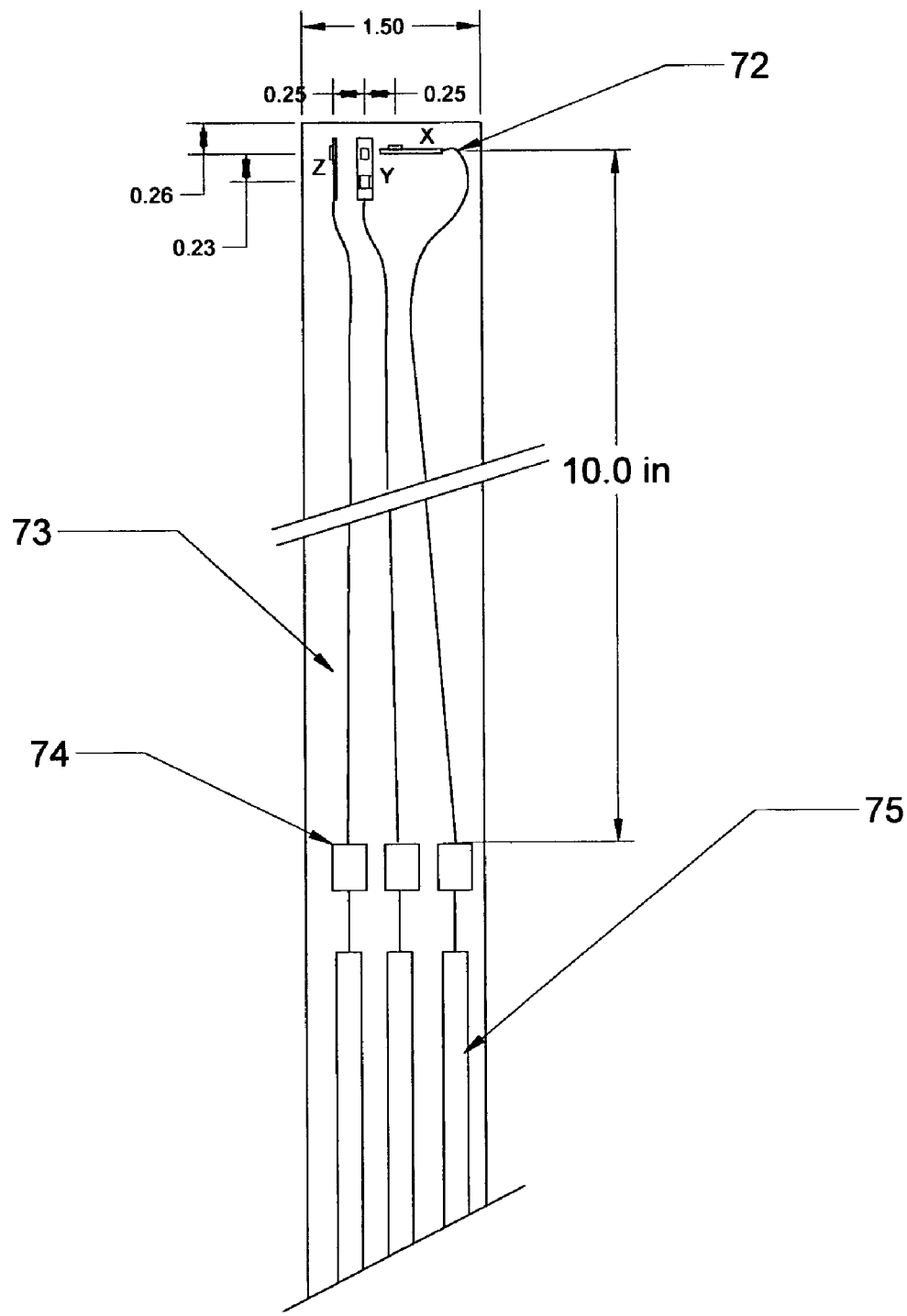

The present invention relates to the measurement of magnetic fields produced by insertion devices in X-ray generating systems, e.g., a synchrotron radiation source or an electron accelerator.

2. BACKGROUND OF THE INVENTION

Short-wavelength synchrotron radiation generated by relativistic electrons in circular accelerators has many applications for studying matter in all its forms. There is currently a high demand at synchrotron facilities world-wide to provide synchrotron radiation of various types for studying particular forms of matter. One of the distinctive characteristics of synchrotron radiation is warping of the globular non-relativistic dipole radiation pattern into a strongly forward peaked distribution, which makes synchrotron radiation highly collimated. Another distinctive characteristic is the shift of the spectrum of the radiation to higher photon energies (higher harmonics of the orbital frequency) as the electron energy increases, with the photon energy at the peak of the distribution varying as $E^3/R$.

Spectral brightness of synchrotron radiation (the photon flux per unit area of the radiation source per unit solid angle of the radiation cone per unit spectral bandwidth) is frequently the most important consideration in experimental analyses that use synchrotron radiation. A beam that has high spectral brightness is highly collimated in both the horizontal and vertical directions. Undulators and wigglers are among the magnetic devices used to regulate the spectral brightness of synchrotron radiation sources. Undulators and wigglers are known collectively as "insertion devices" because they are inserted in the straight sections of synchrotron storage rings.

Undulators and wigglers consist of arrays of magnets of alternating polarity that repetitively bend electron beams back and forth (Schlueter, R. D. (1994), Wiggler and undulator insertion devices, in Synchrotron Radiation Sources: A Primer, Herman Winick, Ed. World Scientific, Singapore, pp. 377–408; Als-Nielsen, J. et al. (2001) Elements of Modern X-Ray Physics, Chapter 2: Sources of X-rays, John Wiley and Sons, Chichester UK). A common type of insertion device, the planar undulator, is an array of closely spaced, vertically oriented dipole magnets of alternating polarity. As the synchrotron's electron beam passes longitudinally through the magnetic array, its trajectory oscillates in the horizontal plane. Because the magnetic field produced by the undulator is relatively weak, the radiation cones emitted at each bend in the electron beam's trajectory overlap, giving rise to constructive interference that results in one or a few spectrally narrow peaks (a fundamental and harmonics). Thus the electron beam produced has high spectral brightness, i.e., it is highly collimated in both the horizontal and vertical directions, and it is highly coherent as a result of the periodicity. Tuning the wavelengths of the harmonics is carried out by mechanically adjusting the vertical spacing (gap) between the pole tips of the magnets (X-Ray Data Booklet, January 2001, Center for X-Ray Optics and Advanced Light Source, Lawrence Berkeley National Laboratory, University of California, Berkeley Calif. 94720).

An accurate characterization of the magnetic field produced by an insertion device is essential to the design and maintenance of precise X-ray generation, particularly in the case of undulators. Such characterization of the magnetic field usually consists of a volumetric map of the magnetic field strength (B magnetic-field vector) taken every millimeter in the X-, Y- and Z-axes. Some laboratories have dedicated equipment solely for this purpose. Great precision is required, both in the sensitivity of the magnetic field measurement and in the positioning of the sensor at the location where the measurement is to be taken. Such precise positioning is frequently difficult to achieve, owing to the length of the insertion devices, their great weight, and the close alignment requirements between the insertion device and the apparatus. Moving the measurement equipment to the work site when characterization is required is also difficult. Currently, to characterize the magnetic field of the insertion device, the insertion device must be removed from the synchrotron storage ring. This can entail considerable labor and expense if it must be removed from the ring and transported to a remote site for measurement and testing. As the insertion device is being moved to and from the remote testing site, it runs the considerable risks of misalignment and/or damage. Hence, there is a considerable need in the art for equipment for measuring the magnetic field produced by an insertion device that is easy to move and/or install in a location proximate to the insertion device.

Citation or identification of any reference in Section 2, or in any other section of this application, shall not be considered an admission that such reference is available as prior art to the present invention.

3. SUMMARY OF THE INVENTION

The present invention provides an apparatus for measuring the magnetic field produced by an insertion device that is easy to move and/or install in a location proximate to the insertion device. The measurements can be made within eight hours, during a regularly scheduled shut-down time for the storage ring. The invention provides an apparatus for measuring, along at least one axis (X, Y or Z), a magnetic field produced by an insertion device in an X-ray or UUV generating system. The invention is based on the surprising discovery, on the part of the inventors, that an apparatus for measuring a magnetic field produced by an insertion device can be constructed so that it can be installed directly on the insertion device, thus permitting measurement of the magnetic field strength without moving the insertion device to a remote site. The apparatus of the invention provides a low-cost and efficient means to measure the magnetic field produced by an insertion device, because it obviates the need to remove the insertion device from its location, e.g., from a section of the beam path of a synchrotron storage ring. In one embodiment, the apparatus is installed permanently on the insertion device. In other embodiments, some or all portions of the apparatus can be removed from one insertion device and installed on another insertion device for use in making measurements, according to the needs of the user.

The invention provides an apparatus for measuring a magnetic field produced by an insertion device comprising:
(a) a magnetic field strength sensor, wherein the sensor produces an output signal;
(b) a first stage for positioning the sensor along a first axis of the insertion device, wherein:
  (i) the first stage comprises:
    (a) a first stage carriage,
    (b) first stage guide means comprising a first end and a second end,
    (c) a first stage motor,
    (d) a first stage drive mechanism, and
    (e) first stage position-sensing means, and
  (ii) the first stage guide means is mounted on the insertion device, wherein:
    (f) the axis of the first stage guide means is parallel with the first axis, and
    (g) the first axis is the long axis of the insertion device;
(c) means for controlling position of the first stage;
(d) a second stage for positioning the sensor along a second axis of the insertion device, wherein:
  (i) the second stage comprises:
    (a) a second stage carriage,
    (b) second stage guide means,
    (c) a second stage motor,
    (d) a second stage drive mechanism, and
    (e) second stage position-sensing means,
  (ii) the second axis is perpendicular to the first axis, and
  (iii) the second stage is mounted on the first stage;
(e) means for controlling position of the second stage;
(f) a third stage for positioning the sensor along a third axis of the insertion device, wherein:
  (i) the third stage comprises:
    (a) a third stage carriage,
    (b) third stage guide means,
    (c) a third stage motor,
    (d) a third stage drive mechanism, and
    (e) third stage position-sensing means,
  (ii) the third axis is perpendicular to the first axis and to the second axis;
  (iii) the third stage is mounted on the second stage, and
  (iv) the sensor is mounted on the third stage;
(g) means for controlling position of the third stage; and
(h) information storage means for reading the output signal from the sensor operably connected to the sensor.

In one embodiment,
(i) the means for controlling position of the first stage,
(ii) the means for controlling position of the second stage,
(iii) the means for controlling position of the third stage, and
(iv) the information storage means
is a digital computer.

In another embodiment, the first axis is parallel with the electron beam line within the insertion device.

In another embodiment, the output signal is an analog signal.

In another embodiment, the apparatus additionally comprises:
(j) means for converting the analog signal to a digital signal operably connected to the sensor.

In another embodiment, the apparatus additionally comprises:
(k) means for amplifying the analog signal operably connected to the sensor.

In another embodiment, the apparatus additionally comprises:
(l) means for converting an amplified analog signal to a digital signal operably connected to the amplifying means.

In another embodiment, the sensor comprises a Hall-effect probe.

In another embodiment, the apparatus additionally comprises:
(m) means for amplifying the analog signal operably connected to the Hall-effect probe;
(n) a teslameter operably connected to the amplifying means;
(o) means for converting an amplified analog signal to a digital signal operably connected to the information storage means.

In another embodiment, the output signal is a digital signal.

In another embodiment, the first stage guide means is a granite guide rail.

In another embodiment, the first stage guide means is a pair of steel guide rails.

In another embodiment, a portion of the apparatus is removable.

In another embodiment, the removable portion of the apparatus is the entire apparatus.

In another embodiment, the first stage motor comprises a slider and a stator.

In another embodiment, the removable portion of the apparatus comprises the third stage, the second stage, the first stage carriage, the slider of the first stage motor, the first stage drive mechanism and the first stage position-sensing means.

In another embodiment, the apparatus additionally comprises means for positioning the removable portion of the apparatus on a holding cart.

In another embodiment, the means for positioning the removable portion of the apparatus is a mating guide socket mounted on the first end of the first stage guide means.

The invention also provides a method for measuring magnetic fields produced by at least two insertion devices comprising:
(1) installing on a first insertion device an apparatus for measuring a magnetic field produced by the insertion device wherein the apparatus comprises a removable portion and wherein the apparatus comprises:
  (a) a magnetic field strength sensor, wherein the sensor produces an output signal;
  (b) a first stage for positioning the sensor along a first axis of the insertion device, wherein:
    (i) the first stage comprises:
      (a) a first stage carriage,
      (b) first stage guide means comprising a first end and a second end,
      (c) a first stage motor,
      (d) a first stage drive mechanism, and
      (e) first stage position-sensing means, and
    (ii) the first stage guide means is mounted on the insertion device, wherein:
      (f) the axis of the first stage guide means is parallel with the first axis, and
      (g) the first axis is the long axis of the insertion device;

(c) means for controlling position of the first stage;
(d) a second stage for positioning the sensor along a second axis of the insertion device, wherein:
　　(i) the second stage comprises:
　　　　(a) a second stage carriage,
　　　　(b) second stage guide means,
　　　　(c) a second stage motor,
　　　　(d) a second stage drive mechanism, and
　　　　(e) second stage position-sensing means,
　　(ii) the second axis is perpendicular to the first axis, and
　　(iii) the second stage is mounted on the first stage;
(e) means for controlling position of the second stage;
(f) a third stage for positioning the sensor along a third axis of the insertion device, wherein:
　　(i) the third stage comprises:
　　　　(a) a third stage carriage,
　　　　(b) third stage guide means,
　　　　(c) a third stage motor,
　　　　(d) a third stage drive mechanism, and
　　　　(e) third stage position-sensing means,
　　(ii) the third axis is perpendicular to the first axis and to the second axis;
　　(iii) the third stage is mounted on the second stage, and
　　(iv) the sensor is mounted on the third stage;
(g) means for controlling position of the third stage; and
(h) information storage means for reading the output signal from the sensor operably connected to the sensor;
(2) measuring a magnetic field produced by the first insertion device with the apparatus;
(3) removing the removable portion of the apparatus from the first insertion device;
(4) installing the removable portion of the apparatus on a second insertion device; and
(5) measuring a magnetic field produced by the second insertion device with the apparatus installed on the second insertion device.

In one embodiment of the method, the removable portion of the apparatus is the entire apparatus.

In another embodiment of the method, the first stage motor comprises a slider and a stator.

In another embodiment of the method, the removable portion of the apparatus comprises the third stage, the second stage, the first stage carriage, the slider of the first stage motor, the first stage drive mechanism and the first stage position-sensing means and wherein a second first stage guide means and a second first stage motor stator are installed on the second insertion device.

In another embodiment of the method, the apparatus additionally comprises means for positioning the removable portion of the apparatus on a holding cart.

In another embodiment of the method, the means for positioning the removable portion of the apparatus is a mating guide socket mounted on the first end of the first stage guide means.

4. BRIEF DESCRIPTION OF THE DRAWINGS

The present invention is described herein with reference to the accompanying drawings, in which similar reference characters denote similar elements throughout the several views. It is to be understood that in some instances, various aspects of the invention may be shown exaggerated or enlarged to facilitate an understanding of the invention.

FIG. 1 shows a schematic diagram of a set of X, Y, Z Hall probes (72). 73, wires from Hall probes to printed circuit boards (amplifiers). 74, printed circuit boards (amplifiers). 75, jacketed cables to teslameter. Dimensions of a typical set of Hall probes are indicated in inches.

Figure 2:
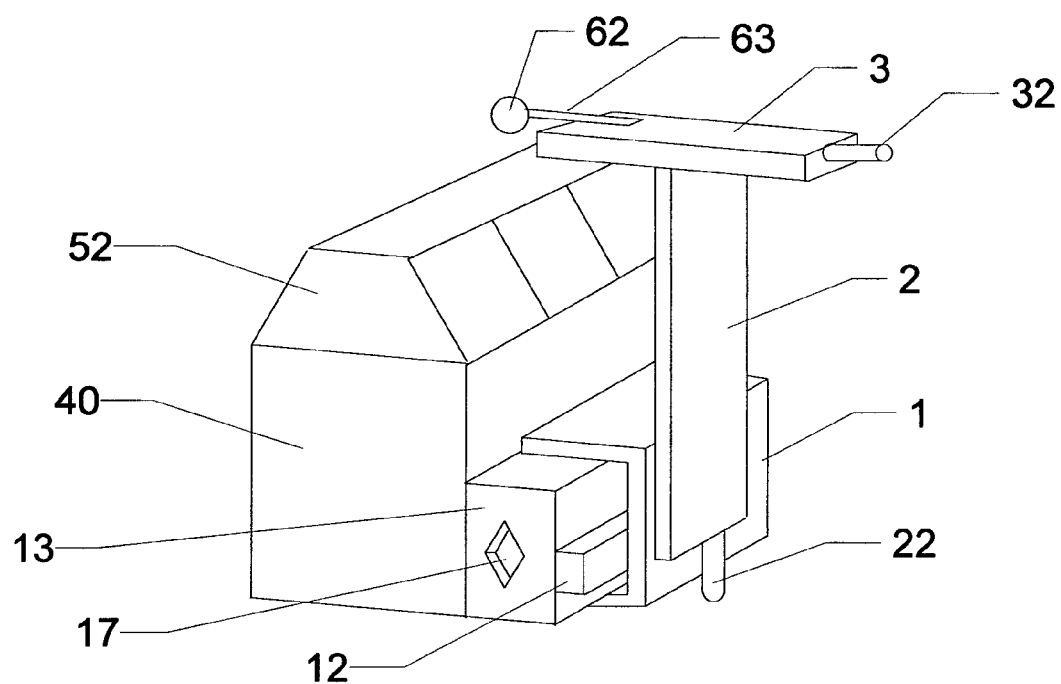

FIG. 2 shows a schematic diagram of an embodiment of the apparatus of the invention. 1, first stage. 2, second stage. 3, third stage. 12, first (Z-)stage motor (stator). 13, first (Z-)stage guide means. 17, mating guide socket on first (Z-)stage guide means. 22, second (Y-)stage motor. 32, third (X-)stage motor. 40, frame of insertion device. 52, lower magnet assembly of insertion device. 62, magnetic field strength sensor. 63, sensor mount.

Figure 3:
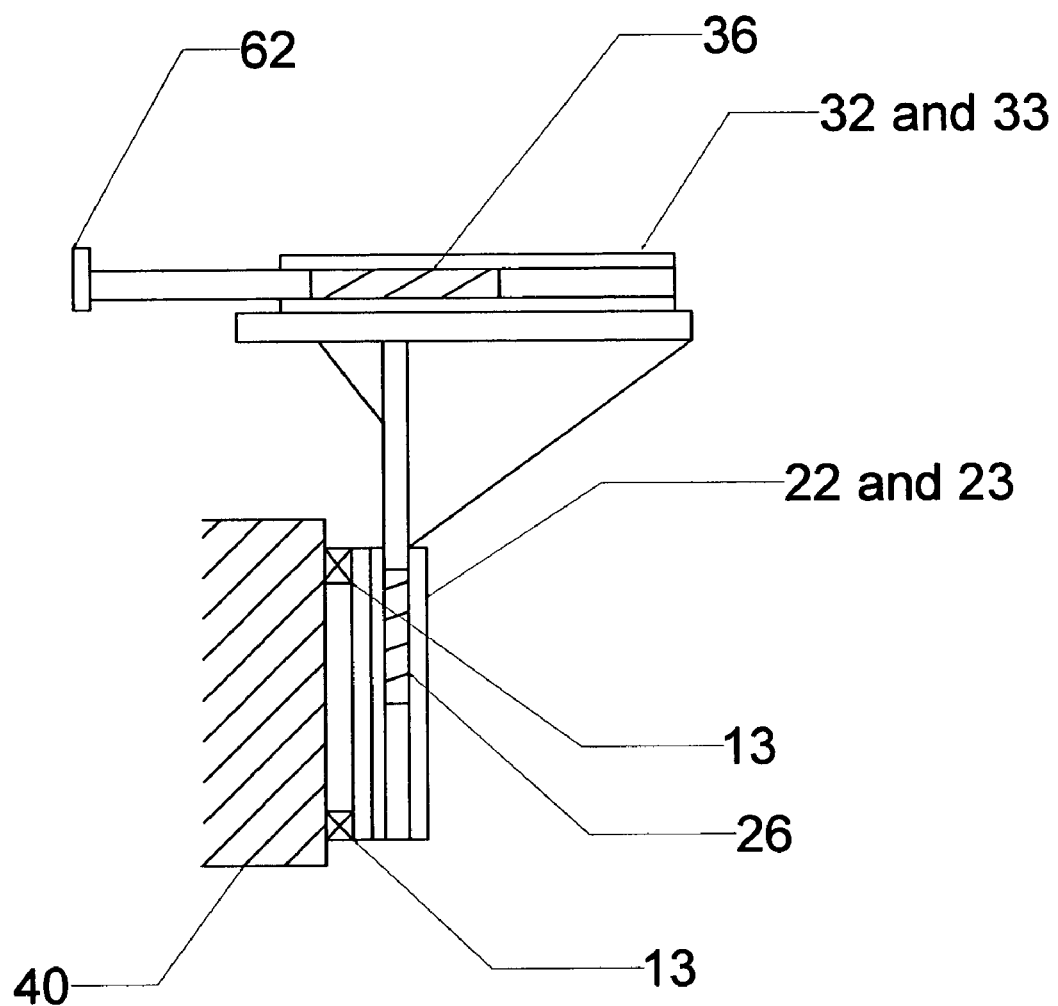

FIG. 3 shows a schematic diagram of a side view of the removable portion in a specific embodiment of the apparatus of the invention. 13, first (Z-)stage guide means. 22, second (Y-)stage motor. 23, second (Y-)stage guide means. 26, slider portion of the second (Y-)stage motor. 32, third-(X-)stage motor. 33, third-(X-)stage guide means. 36, slider portion of the third (X-)stage motor. 40, frame of insertion device. 62, magnetic field strength sensor.

Figure 4:
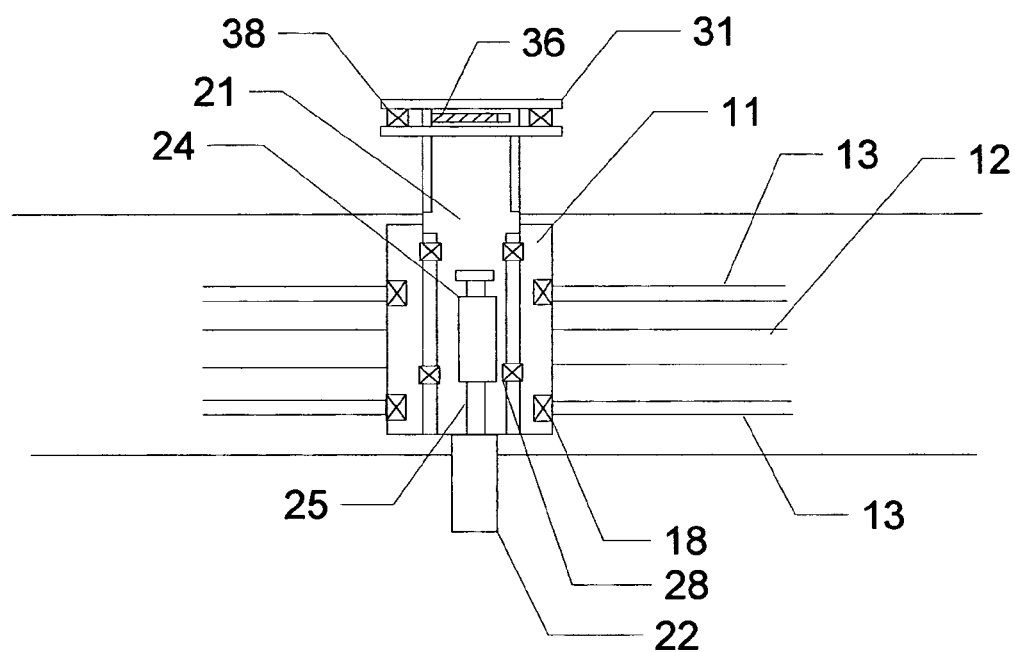

FIG. 4 shows a schematic diagram of the front view of the removable portion in a specific embodiment of the apparatus of the invention. 11, first (Z-)stage carriage. 12, first (Z-)stage motor. 13, first (Z-)stage guide means. 18, Z-axis truck mount. 21, second (Y-)stage carriage. 22, second (Y-)stage motor. 24, nut on second (Y-)stage lead screw. 25, second (Y-)stage lead screw (drive mechanism). 28, Y-axis truck mount. 31, third (X-)stage carriage. 36, slider portion of third (X-)stage motor. 38, X-axis truck mount.

Figure 5A:
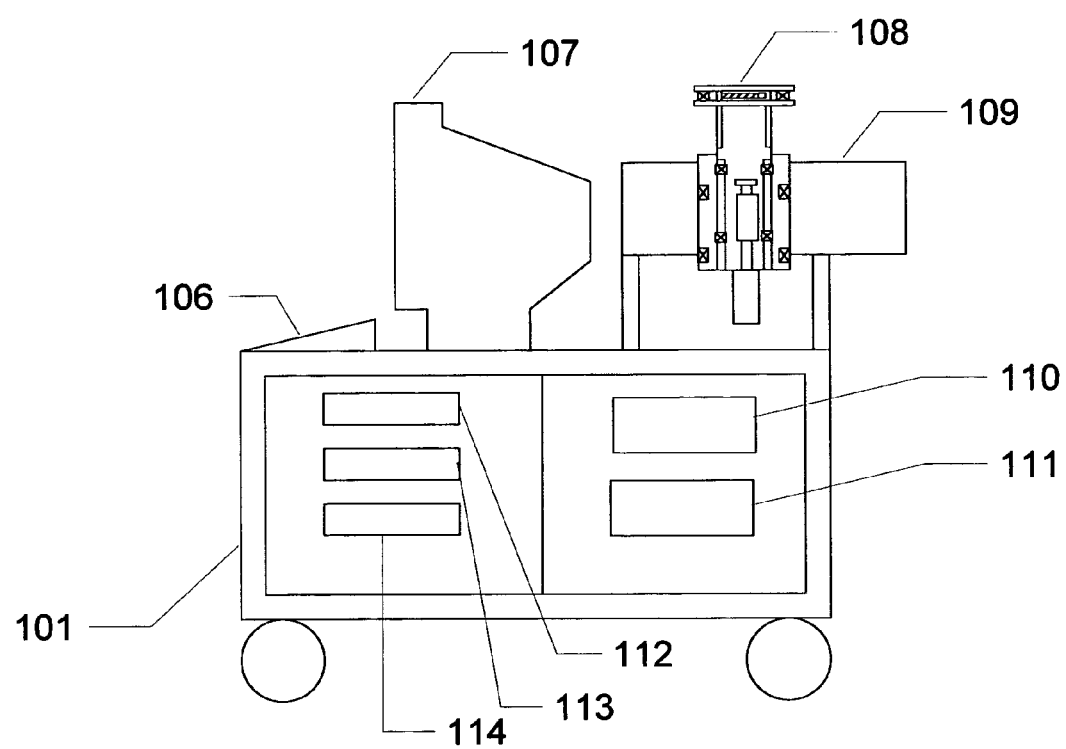
Figure 5B:
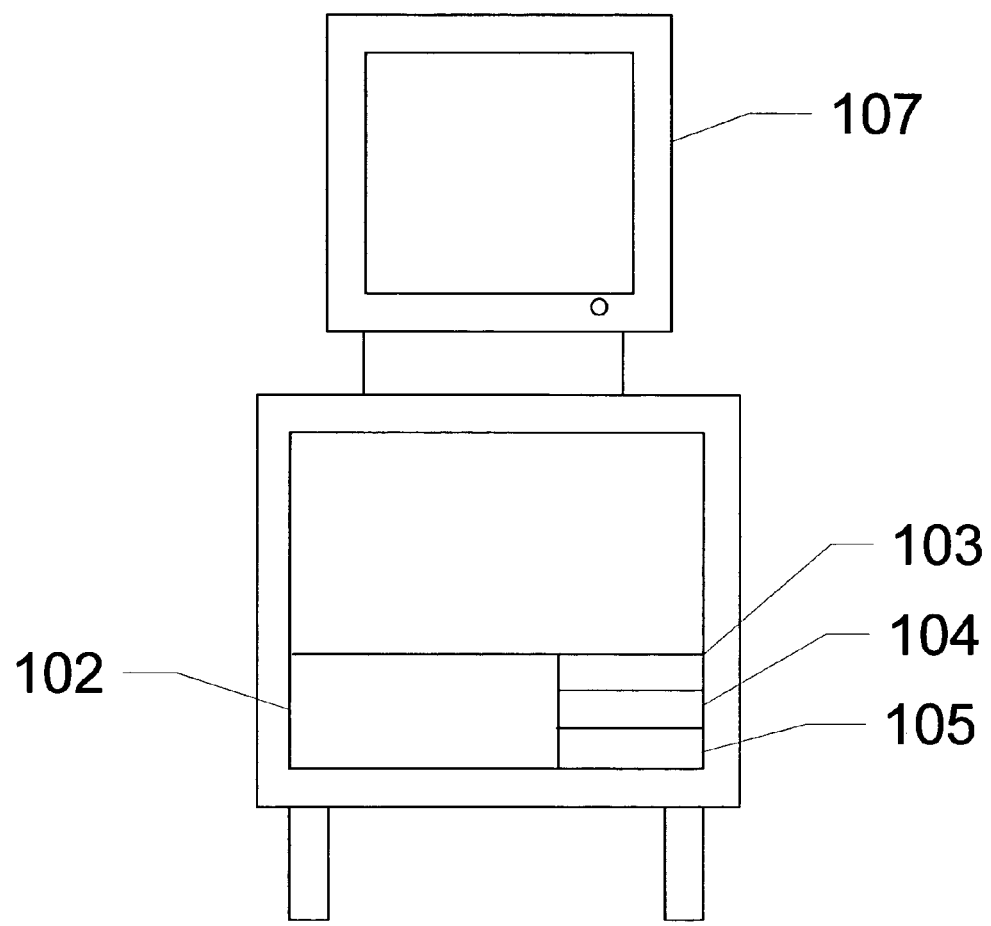

FIGS. 5A–5B. Front view (A) and side view (B) of a holding cart on which is mounted the removable portion of a specific embodiment of the apparatus of the invention. (The removable portion, 108, is shown in FIGS. 3–4.) 101, cart frame. 102, personal computer (PC). 103, PC hard drive. 104, PC CDROM drive. 105, floppy disk drive. 106, PC keyboard. 107, PC display. 109, holding beam of cart. 110, teslameter #1. 111, teslameter #2. 112, digital voltmeter (DVM) #1. 113, DVM #2. 114, DVM #3.

Figure 6:
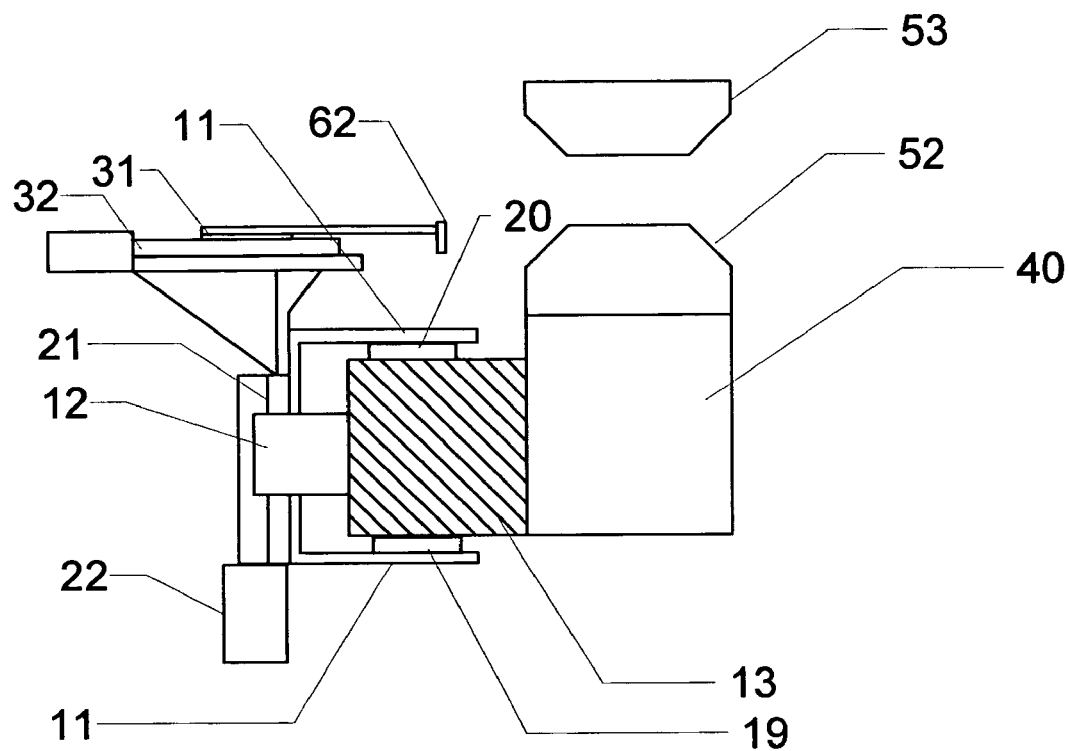

FIG. 6. A schematic diagram of a side view of a specific embodiment of the apparatus of the invention. 11, first (Z-)stage carriage. 12, stator of the first (Z-)stage linear motor. 13, first (Z-)stage guide means. 19, lower vacuum-air bearings. 20, upper vacuum-air bearings. 21, second (Y-)stage carriage. 22, second (Y-)stage motor. 31, third (X-)stage carriage. 32, third (X-)stage motor. 40, frame of insertion device. 52, lower magnet assembly of insertion device. 53, upper magnet assembly of insertion device. 62, magnetic field strength sensor.

Figure 7:
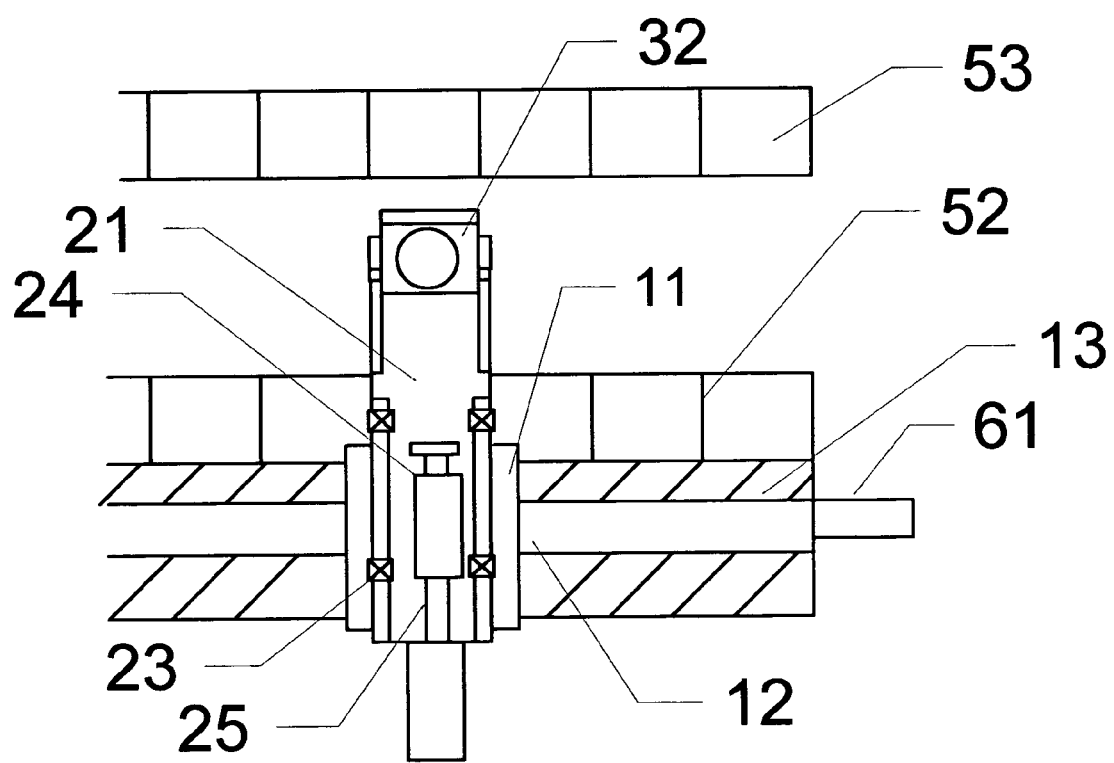

FIG. 7. A schematic diagram of a front view of the specific embodiment of the apparatus of the invention shown in FIG. 6 in side view. 11, first (Z-)stage carriage. 12, first (Z-)stage linear motor. 13, first-(Z-)stage guide means (granite guide rail). 21, second (Y-)stage carriage. 23, second (Y-)stage guide means. 24, nut on second (Y-)stage lead screw. 25, second (Y-)stage lead screw (drive mechanism). 32, third (X-)stage motor. 52, lower magnet assembly of insertion device. 53, upper magnet assembly of insertion device. 61, head of laser position encoder (position-sensing means) on the first (Z-)stage.

Figure 8:
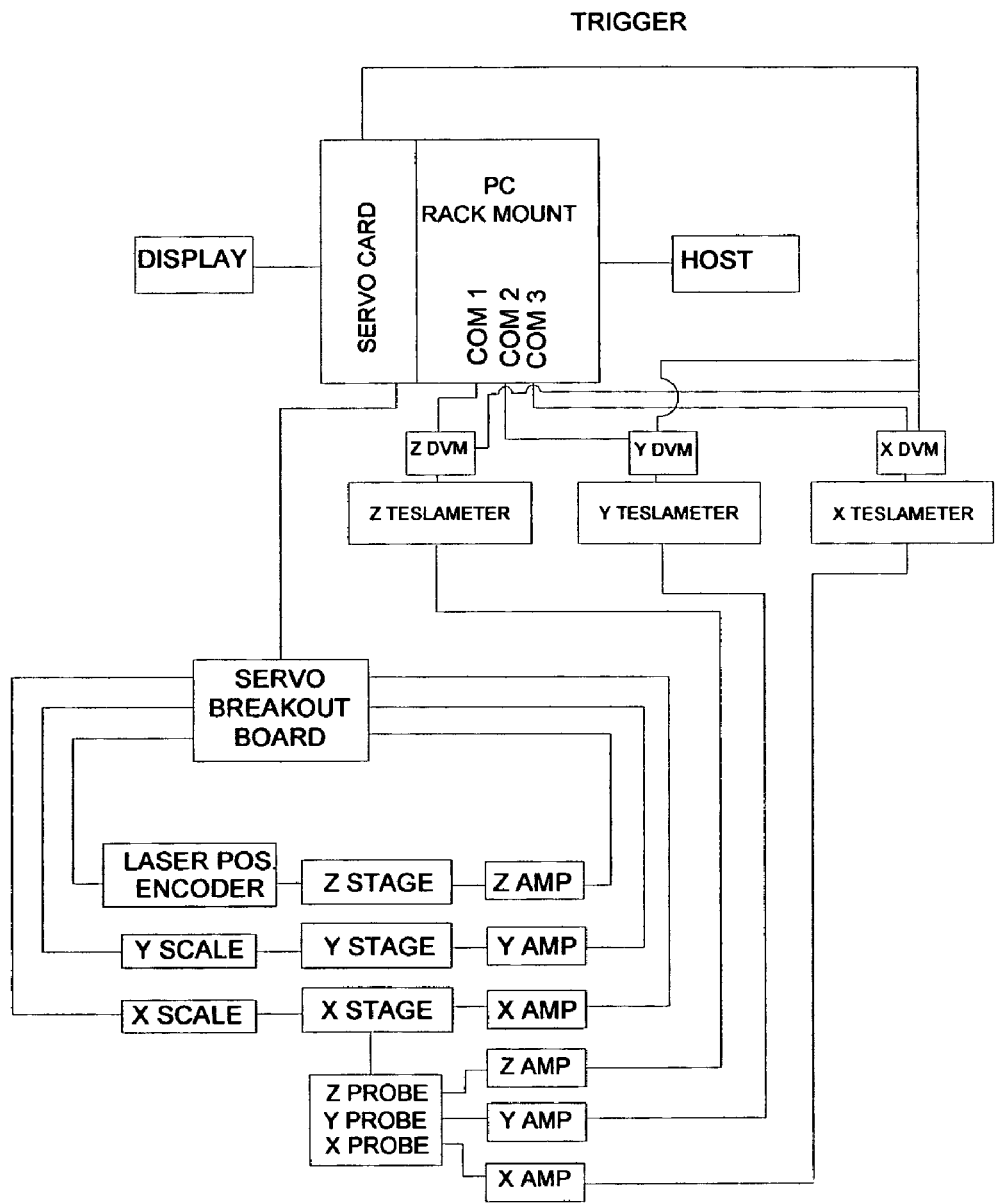

FIG. 8 shows a schematic diagram of the control architecture of an embodiment of the apparatus of the invention.

5. DETAILED DESCRIPTION OF THE INVENTION

The present invention provides an apparatus for measuring the magnetic field strength between the magnet arrays of an insertion device in an X-ray generating system comprising a magnetic field strength sensor that produces an output signal, three stages for positioning the sensor along the X, Y and Z axes of the insertion device, means for controlling positions of the stages and information storage means for reading the output signal operably connected to the sensor. The apparatus eliminates the need for a dedicated measurement facility by mounting guide means for the long (Z-)axis directly to the insertion device. This long-axis guide means can be permanently or temporarily mounted to the insertion device. The remainder of the measurement apparatus may then be transferred onto the long-axis guide means while measurements and, if necessary, adjustments are made. The apparatus is compact, allowing greater access to magnet arrays for adjustment than existing systems.

For clarity of disclosure, and not by way of limitation, the detailed description of the invention is divided into the subsections set forth below.

5.1. Insertion Devices

The invention provides an apparatus for measuring a magnetic field produced by an insertion device in an X-ray generating system, e.g., a synchrotron radiation source or an electron accelerator. Insertion devices include, but are not limited to, undulators and wigglers. The design parameters of undulators (e.g., planar undulators, elliptically polarized undulators) and wigglers are commonly known in the art (see, e.g., U.S. Pat. No. 5,714,850 issued to Kitamura et al., U.S. Pat. No. 6,556,595 issued to Kobayashi et al.; Schlueter, R. D. (1994), Wiggler and undulator insertion devices, in Synchrotron Radiation Sources: A Primer, Herman Winick, Ed. World Scientific, Singapore, pp. 377–408; Als-Nielsen, J. et al. (2001) Elements of Modern X-Ray Physics, Chapter 2: Sources of X-rays, John Wiley and Sons, Chichester UK).

Some insertion devices are inserted in a section of the electron beam path so that their Z-(long) axis is parallel to the beam path within the synchrotron ring, in an arrangement in which the two series of magnets of the insertion device are parallel to, or tilted symmetrically (tapered) with respect to the beam path. For example, the taper can be oriented such that there is a gap of ±5 mm greater at one end of the insertion device than at the other, with the upper and lower beds of the insertion device remaining symmetric about the horizontal plane at all times. Other insertion devices can be inserted in a section of the beam path so that they are oriented without taper with respect to the plane of the beam path in that section.

5.2. Magnetic Field Strength Sensors

The invention provides an apparatus for measuring a magnetic field produced by an insertion device comprising a magnetic field strength sensor. The sensor can produce either an analog or a digital signal. Sensors suitable for measurement of magnetic field strength are well known in the art, e.g., a Hall-effect probe ("Hall probe"). The Hall probe includes a printed circuit board (amplifier), the output of which is sent electronically to a teslameter (Danfysik A/S, Jyllinge, Denmark; GMW Associates, San Carlos, Calif.), which is operably connected to the probe (FIG. 1). Operable connections with probes are well known in the art and include, but are not limited to, wired, wireless or optical connections.

In one embodiment, the output of the teslameter is sent electronically to a digital voltmeter (DVM), e.g., a Keithley 2701 digital voltmeter (Keithley Instruments Inc., Cleveland Ohio).

In another embodiment, one probe is used for each (X-, Y- and Z-)orientation, so that the magnetic field strength sensor comprises a total of three probes.

In another embodiment, a pair of probes is used for each (X-, Y- and Z-)orientation, so that the magnetic field strength sensor comprises a total of six probes. This configuration, using a pair of probes for each axis, permits the user to take measurements along the full extent of the Z-axis of the insertion device, while reducing the length of the guide rails. In certain embodiments, the magnetic field strength in all three dimensions, i.e., along all three axes (X, Y and Z) is measured. In other embodiments, the magnetic field strength in two dimensions or axes (e.g., X and Z, or Y and Z) is measured.

In a specific embodiment, the number of probes used is reduced from six probes to three (one for each of the X-, Y- and Z-axis) by increasing the length of the first stage guide means (e.g., by adding 0.5 meter to each end) which enables the three probes to travel to beyond the edge of the insertion device to a point where the magnetic field strength approaches zero.

In another embodiment, the magnetic field strength sensor is operably connected (e.g., wired) to a standard magnetic-field measuring device such as a teslameter (e.g., DT-151 teslameter available from Danfysik A/S, Jyllinge, Denmark or from GMW Associates, San Carlos, Calif.; F. W. Bell Model 7030 teslameter, Sypris Test & Measurement, Orlando, Fla.). In the embodiment illustrated in FIGS. 2–4 and FIGS. 6–7, each of three moving stages—for the X-, Y- and Z-axis—is used to position a Hall probe (available from GMW Associates, San Carlos, Calif.) associated with the X-, Y- or Z-axis. The Hall probes perform the actual measurement of the magnetic field strength in the insertion device. The output of each Hall probe is sent electronically to a teslameter. In certain embodiments, the teslameter has two or more channels. In a specific embodiment, each of two 3-channel teslameters receives output from a set of XYZ Hall probes. In another embodiment, three 2-channel teslameters are used, and each teslameter receives input from a pair of X-, Y-, or Z-axis probes. In another embodiment, the output of each probe is sent electronically to a different teslameter.

In a specific embodiment, the output from three Hall probes (one each for the X, Y and Z axes) is sent electronically to a single, three-channel teslameter with a separate channel for the X, Y and Z inputs. The output from each channel (X, Y or Z) of the teslameter is sent electronically to a digital voltmeter (DVM) dedicated to that axis (X, Y or Z) so that a total of three DVMs are used.

In the embodiment illustrated in FIGS. 2–4 and FIGS. 6–7, one teslameter is used for each Hall probe in each (X-, Y- and Z-axis) orientation. The DT-151 Teslameter is operably connected (wired) to small Hall probes with an active area of 1×0.5 mm for field mapping. Each channel of the DT-151 Teslameter has 20 bits resolution, which yields a 0.01 Gauss minimum count on a 3 Tesla scale with 0.01% accuracy. At this resolution, the maximum sample rate is 10 samples per second, which translates to a maximum measurement rate of 2 mm/sec at one sample per millimeter. Two sets of probes are typically used for each axis (X, Y and Z) to measure the entire length of the insertion device, unless space can be provided ahead and behind the insertion device to extend the travel of the third stage (Z-axis) position-sensing means.

In another embodiment, the magnetic field strength sensor produces an analog signal, which can be amplified and converted to a digital output signal by techniques well known in the art, e.g., by using a conventional amplifier and a DVM that accepts the trigger input. Thus, in a specific embodiment, the apparatus of the invention additionally comprises means for amplifying the analog signal operably connected (e.g., wired) to the analog magnetic field strength sensor and means for converting an amplified analog signal to a digital signal operably connected (e.g., wired) to the amplifying means.

Because the sensor produces analog output, faster sampling rates can be achieved. In one embodiment, a Keithley 2701 digital voltmeter (Keithley Instruments Inc., Cleveland Ohio) is used. This DVM can take samples at a sample a rate of 500 samples/sec and store up to 50,000 samples, e.g., it can sample every millimeter along the first stage (Z-axis) guide means upon input trigger from a laser position-encoder. In this embodiment, the output of the DVMs is sent electronically via an Ethernet connection to the information storage means.

In a specific embodiment, an analog probe such as a GMW XZM-12-3 analog probe (GMW Associates, San Carlos, Calif.) is used. Output from the analog probe is sent electronically to a custom A/D card or to a DVM.

In certain embodiments, to save the data in digital format, a custom A/D card can be designed using methods commonly known in the art. A custom A/D card can be mounted on each of the stages (e.g., the X-, Y- and Z-stages), to keep the analog cable lengths as short as possible and reduce capacitance. The data are sent via a long line driver or optical fiber to a receiver near the personal computer and deserialized for entry into an information storage device, e.g., a personal computer, via Digital In Digital Output (DIDO). This allows the fastest possible data collection, theoretically in the kHz range.

In another embodiment, the magnetic field strength sensor produces a digital signal. In this embodiment, the direct output of the sensor is sent electronically to the information storage means, e.g., into the RS232, Ethernet or USB port of a personal computer (PC), thereby bypassing A/D conversion.

The data are stored in the information storage means and analyzed using a computer program. Since probes measuring each axis (X, Y and Z) cannot occupy the same point in space, mounting offsets are applied to the data to correct the position of the data points by bringing the X, Y and Z measurements into the same point. For example, Keithley Instruments Inc. (Cleveland Ohio) provides custom software to read data into a MICROSOFT EXCEL® spreadsheet. The custom program uses a spatial sampling frequency, then sorts the XYZ magnetic field data from the sensor to put the data from the three axes at the same point in space. The data are displayed on the information storage means, e.g., a personal computer.

In certain embodiments, the entire magnetic-field strength sensor, comprising the probes and an associated magnetic-field strength measuring device (e.g., a teslameter) is mounted on the third stage of the apparatus. In another (more-preferred) embodiment, the magnetic-field strength sensor comprises a probe that is mounted on the third stage and a magnetic-field strength measuring device that is not mounted on the third stage (e.g., it is located at a position external to the insertion device, such as a location proximate to the user or on the holding cart).

In certain embodiments, the apparatus of the invention comprises means for triggering the digital voltmeters (DVMs) that are associated with the X, Y and Z axes to return a measurement. For example, in one embodiment, feedback from the first stage position-sensing means, e.g., a laser position encoder, can be used to generate a trigger at regular intervals (e.g., 0.1 mm intervals, 0.5 mm intervals, 1.0 mm intervals, 2.0 mm intervals) along the Z-axis. The trigger activates the DVMs associated with the X, Y and Z axes to take readings at these regular intervals. In another embodiment, the means for triggering the DVMs can be a digital computer.

5.3. Stages for Positioning the Sensor

The present invention comprises stages for positioning the sensor along axes of the insertion device. Mechanical stages for positioning sensors or probes are well known in the art, and can be either custom-fabricated or obtained commercially (Advanced Design Consulting, Inc., Lansing, N.Y.; Parker Hannifin Corporation, Daedal Division, Irwin, Pa.; Aerotech Inc., Pittsburgh, Pa.; Danaher Precision Systems, Dover Division, Washington, D.C.).

In one embodiment, the invention comprises a first stage for positioning the sensor along a first axis of the insertion device, wherein:
  (i) the first stage comprises:
    (a) a first stage carriage,
    (b) first stage guide means comprising a first end and a second end,
    (c) a first stage motor,
    (d) a first stage drive mechanism, and
    (e) first stage position-sensing means, and
  (ii) the first stage guide means is mounted on the insertion device, wherein:
    (f) the axis of the first stage guide means is parallel with the first axis, and
    (g) the first axis is the long axis of the insertion device.

The apparatus also comprises a second stage for positioning the sensor along a second axis of the insertion device, wherein:
  (i) the second stage comprises:
    (a) a second stage carriage,
    (b) second stage guide means,
    (c) a second stage motor,
    (d) a second stage drive mechanism, and
    (e) second stage position-sensing means,
  (ii) the second axis is perpendicular to the first axis, and
  (iii) the second stage is mounted on the first stage.

The apparatus also comprises a third stage for positioning the sensor along a third axis of the insertion device, wherein:
  (i) the third stage comprises:
    (a) a third stage carriage,
    (b) third stage guide means,
    (c) a third stage motor,
    (d) a third stage drive mechanism, and
    (e) third stage position-sensing means,
  (ii) the third axis is perpendicular to the first axis and to the second axis;
  (iii) the third stage is mounted on the second stage, and
  (iv) the sensor is mounted on the third stage.

The second stage positions the sensor along a second axis which is perpendicular to the first axis (the Z-axis or axis of the first stage guide means). The third stage positions the sensor along a third axis, which is perpendicular to the first axis and to the second axis. The second stage is mounted on the first stage and the third stage is mounted on the second stage. The magnetic field strength sensor is mounted on the third stage.

In a specific embodiment, the third stage positions the sensor in the X-axis and is mounted on the second stage, which positions the sensor in the Y-axis. The second stage is mounted on the first stage, which positions the sensor along the long (Z-axis) and which is mounted on the first stage guide means. In this embodiment, the third (X-axis) stage bears the magnetic field strength sensor. FIGS. 2–4 and FIGS. 6–7 illustrate this embodiment, in which the three stages are used to position, in three dimensions, a set of X-, Y- and Z-axis Hall probes.

In another specific embodiment, the third stage positions the sensor in the Y-axis and is mounted on the second stage, which positions the sensor in the X-axis. The second stage is mounted on the first stage, which positions the sensor along the long (Z-axis) and which is mounted on the first stage guide means. In this embodiment, the third (Y-axis) stage bears the magnetic field strength sensor.

The first, second and third stage carriages may be any moveable carriage known in the art that is suitable for use as a high-precision mechanical stage.

5.4. First Stage Guide Means

The apparatus of the invention comprises a first stage wherein the first stage comprises first stage guide means. The first stage guide means enables positioning of the first stage along the long (Z-)axis of the insertion device, preferably at nanometer resolution. In certain embodiments, the first stage guide means is mounted on the insertion device so that the axis of the first stage guide means is parallel with the first axis, and the first axis is the long axis of the insertion device. In a specific embodiment, the long axis is parallel with the section of the electron beam path running within the insertion device.

In another embodiment, the first stage guide means is mounted on one of the girders of the insertion device. In another embodiment, for use with undulators oriented so that the beam path lies within the XZ symmetry plane of a tapered magnet arrangement, the first stage guide means is attached to a frame (and not to a girder) on the insertion device, so as to remain parallel with the beam path.

In the embodiment depicted in FIG. 6, the apparatus of the invention is mounted directly on the front of the insertion device (e.g., an undulator) so that it is parallel to the magnet axis of the insertion device. In this embodiment, the guide rail is constructed of a single piece of granite that is milled to submicron flatness and hand-lapped according to methods well known in the art. The granite guide rail has the advantages of being light (it has the same mass density as aluminum), of having no influence on the magnetic field of the insertion device, and of being thermally stable. (Granite is stress-relieved over millions of years, i.e., it is an aggregate of small grains because of repeated fractures and compressions, and does not expand or compress appreciably with changes in temperature.)

In the embodiment depicted in FIG. 6, the granite guide rail is mounted to the face of the insertion device. The first stage guide means is designed to provide a smooth, flat, and precise surface for friction-free movement of the vacuum-air bearings that support the first (Z-axis) stage. The first stage is also designed to ensure minimum tilt because the vacuum-air bearings force the first stage to be parallel to the precise granite surface.

In other embodiments, the first stage guide means is a rail (or a pair of rails) made of steel (e.g., non-magnetic stainless steel), aluminum, magnesium, composite or ceramic.

In certain embodiments, the first stage guide means also comprises bearings that allow the carriage to move along the first stage guide means. Bearings can employ a rolling or a sliding action. In one embodiment, air bearings (New Way Precision, Aston Pa.) are used with granite or ceramic first stage guide means. In another embodiment, mechanical bearings are used with steel or ceramic first stage guide means.

5.5. Second and Third Stage Guide Means

As discussed above, the first (Z-axis) stage uses guide means that enables positioning of the stage along the long axis of the insertion device, preferably at nanometer resolution. The second and third stages also use guide means, e.g., precision mechanical guide rails, that enable positioning of each stage, preferably at nanometer resolution. Precision mechanical guide rails for moveable stages are well known in the art, and may be either custom-made or obtained commercially, e.g., sold along with a precision stage (e.g., Catalog nos. DS 100-50/100/150/200, Motorized precision crossed roller slide, Advanced Design Consulting, Inc., Lansing N.Y.).

As in the first stage guide means, the second and third stage guide means also comprise bearings that allow the stage to move along the guide means. Bearings suitable for use in moving the stages are commonly known in the art. In one embodiment, mechanical bearings are used. In another embodiment, air bearings (New Way Precision, Aston Pa.) are used.

In one embodiment, the third (X-axis) stage has a travel of 150 mm along the third stage guide means, the second (Y-axis) stage has a travel of 350 mm along the second stage guide means, and the first (Z-axis) stage has a travel of 2000 mm along the first stage guide means.

5.6. Motors and Stage Drive Mechanisms

The first, second and third stages each comprise a motor, which is used to power a drive mechanism, which is used to move the carriage. Linear motors, rotary motors and drive mechanisms suitable for use in precision mechanical stages are well known in the art.

In one embodiment, the motor is a linear motor comprising a slider (or forcer) and a stator. In a specific embodiment, the first stage motor is a linear motor. For example, the first stage guide means can be a pair of non-magnetic stainless steel rails and the first stage motor can comprise a moveable slider (e.g., Catalog nos. DS100-50/100/150/200, Motorized precision crossed roller slide, Advanced Design Consulting, Inc., Lansing N.Y.).

In another embodiment, the motor is a rotary motor and the drive mechanism is a lead screw, ball screw (e.g., NSK Corporation, Ann Arbor Mich.; THK America Inc., Mahwah, N.J.) or worm drive. In a specific embodiment, the second and third stage motors are rotary motors.

In another embodiment, a linear motor (Parker Hannifin Corporation, Compumotor Division, Rohnert Park, Calif.) serves as both the motor and the drive mechanism, driving the stage on the mechanical bearings or air bearings (or vacuum-air bearings) of the stage guide means.

In certain embodiments, for example, the embodiment depicted in FIG. 7, the second and third stages are driven by a rotary motor on precision, zero-backlash, ball screws (i.e., the drive mechanism) on mechanical bearings of the second and third stage guide means, and the first stage is driven by a linear motor on air bearings of the first stage guide means.

5.7. Stage Position-Sensing Means

The first, second and third stages each comprise position-sensing means. Preferably, the position-sensing means have nanometer resolution. Position-sensing means suitable for use in the invention are well known in the art. For example, an optical linear position encoder can be used, such as a tape- and glass-based linear encoder with nanometer resolution (e.g., a Renishaw tape scale that has a resolution of 50 nm, Renishaw plc, New Mills, Wotton-under-Edge, Gloucestershire, United Kingdom). In certain embodiments, a laser position encoder with resolution on the order of 10 nm is used (Renishaw plc, New Mills, Wotton-under-Edge, Gloucestershire, United Kingdom; Optodyne, Compton, Calif.; Hewlett-Packard, Palo Alto, Calif.; Zygo, Middlefield, Conn.).

In the embodiment depicted in FIGS. 2–4 and FIGS. 6–7, the positions of the second (Y-axis) and third (X-axis) stages are measured with a Renishaw tape scale. The position of the first (Z-axis) stage is measured with a laser position encoder providing laser feedback.

In certain embodiments, feedback from the laser position encoder on the first stage is used to generate a trigger at regular intervals (e.g., 0.1 mm intervals, 0.5 mm intervals, 1.0 mm intervals, 2.0 mm intervals) along the Z-axis. The trigger activates the magnetic field strength sensor to take readings at these regular intervals.

5.8. Means for Controlling Position of the Stages

The invention also comprises means for controlling position of the first stage, means for controlling position of the second stage and means for controlling position of the third stage. In one embodiment, the means for controlling position of one or more of the stages is a digital computer.

The means for controlling the first stage is operably connected to the first stage. The means for controlling the second stage is operably connected to the second stage. The means for controlling the third stage is operably connected to the third stage. Being operably connected includes, but is not limited to, being electronically connected by a wired connection, a wireless connection or an optical connection.

In one embodiment, the means for controlling position of the first stage, the means for controlling position of the second stage, the means for controlling position of the third stage and the information storage means is a digital computer.

In the embodiment illustrated in FIG. 8, the movement of the first (Z-)stage is controlled by a servo, and the movement of the second stage and the third stage is controlled by a stepper. The servo and the steppers are controlled with a Parker Model 2000 Accro-Loop 4 axis servo card (Parker Hannifin Corporation, Daedal Division, Irwin, Pa.) mounted in a personal computer. A custom computer program is used to read the three-axes measurements and save the data to a file in the computer. Since in this embodiment, the components of the sensor (i.e., the three Hall probes) are not all in the same package, the computer program uses a mounting offset to correct the position of the data points. For example, Keithley Instruments Inc. (Cleveland Ohio) provides custom software to read data into a MICROSOFT EXCELS spreadsheet. The custom program then sorts XYZ position data to put them all at the same point in space.

As described previously in Section 5.2, in certain embodiments, to save the data in digital format, a custom A/D card can be designed using methods commonly known in the art. A custom A/D card can be mounted on each of the stages (e.g., the X-, Y- and Z-stages), to keep the analog cable lengths as short as possible and reduce capacitance. The data are sent via a long line driver or optical fiber to a receiver near the personal computer and deserialized for entry into an information storage device, e.g., a personal computer, via Digital In Digital Output (DIDO). This allows the fastest possible data collection, theoretically in the kHz range.

5.9. Signal-Amplifying and Signal-Conversion Means

In certain embodiments, the apparatus of the invention also comprises means for amplifying the analog signal produced by the magnetic field strength sensor operably connected to the sensor. Suitable conventional amplifiers for use in the invention are known in the art, such as an electronic, bipolar (e.g., from −10V to +10V), analog amplifier with low noise.

In the embodiment illustrated in FIG. 1, the Hall probe includes an amplifier (printed circuit board).

In certain embodiments, the apparatus of the invention also comprises means for converting an amplified analog signal to a digital signal (e.g., a DVM) operably connected to the amplifying means. The digital output produced by the conversion means is sent electronically to an information storage device (e.g., a computer) for data storage and processing.

When a digital sensor is used, an amplifier can be omitted, and the digital measurement can be taken as a "move-stop-read" digital measurement relayed via input to an RS232, Ethernet, USB or DIDO port in the computer. In a "move-stop-read" digital measurement, the moving stage must be brought to a stop, so that the Hall probe can stop vibrating and settle before taking a reading. Certain deceleration profiles, well known in the art, can be used to reduce this settling time.

5.10. Removable Portion of the Apparatus

The invention provides a method for measuring a magnetic field produced by an insertion device comprising removing the removable portion of the apparatus from one insertion device and installing the removable portion on another insertion device for use in making measurements. Hence according to the invention, some portion or all of the apparatus of the invention is preferably removable from the insertion device.

In one embodiment, the invention provides a method for measuring magnetic fields produced by at least two insertion devices comprising:

(1) installing on a first insertion device an apparatus for measuring a magnetic field produced by the insertion device wherein the apparatus comprises a removable portion and wherein the apparatus comprises:
  (a) a magnetic field strength sensor, wherein the sensor produces an output signal;
  (b) a first stage for positioning the sensor along a first axis of the insertion device, wherein:
    (i) the first stage comprises:
      (a) a first stage carriage,
      (b) first stage guide means comprising a first end and a second end,
      (c) a first stage motor,
      (d) a first stage drive mechanism, and
      (e) first stage position-sensing means, and
    (ii) the first stage guide means is mounted on the insertion device, wherein:
      (f) the axis of the first stage guide means is parallel with the first axis, and
      (g) the first axis is the long axis of the insertion device;
  (c) means for controlling position of the first stage;
  (d) a second stage for positioning the sensor along a second axis of the insertion device, wherein:
    (i) the second stage comprises:
      (a) a second stage carriage,
      (b) second stage guide means,
      (c) a second stage motor,
      (d) a second stage drive mechanism, and
      (e) second stage position-sensing means, (ii) the second axis is perpendicular to the first axis, and
(iii) the second stage is mounted on the first stage;
(e) means for controlling position of the second stage;
(f) a third stage for positioning the sensor along a third axis of the insertion device, wherein:
(i) the third stage comprises:
(a) a third stage carriage,
(b) third stage guide means,
(c) a third stage motor,
(d) a third stage drive mechanism, and
(e) third stage position-sensing means,
(ii) the third axis is perpendicular to the first axis and to the second axis;
(iii) the third stage is mounted on the second stage, and
(iv) the sensor is mounted on the third stage;
(g) means for controlling position of the third stage; and
(h) information storage means for reading the output signal from the sensor operably connected to the sensor;
(2) measuring a magnetic field produced by the first insertion device with the apparatus;
(3) removing the removable portion of the apparatus from the first insertion device;
(4) installing the removable portion of the apparatus on a second insertion device; and
(5) measuring a magnetic field produced by the second insertion device with the apparatus installed on the second insertion device.

In one embodiment, the removable portion of the apparatus comprises the third stage, the second stage, the first stage carriage, the slider of the first stage motor, the first stage drive mechanism and the first stage position-sensing means. In this embodiment, the first stage guide means and the stator of the first stage motor both remain attached to the first insertion device. A second first stage guide means and a second first stage motor stator are installed on a second insertion device. In this embodiment, the removable portion of the apparatus can be removed from the insertion device on which it is installed, and can be transported (e.g., using the holding cart) to the second insertion device to perform magnetic field measurements. Magnetic field measurements can thus be performed on one or more additional insertion devices.

An attractive feature of this embodiment is that all that remains installed on the first insertion device is the first stage guide means and the stator of the first stage motor. Both the first stage guide means and the stator of the first stage motor are critically aligned to the beam path only once (generally upon installation of the apparatus of the invention). This reduces the setup time required for subsequent measurements. The removable portion of the apparatus can be easily transported to other insertion devices (e.g., using the holding cart) to perform measurements. This significantly reduces costs, since one apparatus can be used on any number of insertion devices (as long as each insertion device has a corresponding stator for the first stage motor and corresponding first stage guide means installed). It also avoids the problem of radiation damage to the apparatus of the invention were it to remain unshielded and exposed to the beam path.

In the embodiments depicted in FIGS. 2–4 and FIGS. 6–7, the first, second and third stages are easily removable, with the exception of the stator of the first stage motor and the first stage guide means, which both remain attached to the insertion device. This removable portion of the apparatus can be removed from the first stage guide means onto a holding cart (FIGS. 5A–5B). The removable portion of the apparatus can then be moved, either to storage or to another insertion device for use in performing magnetic field measurements.

In another embodiment, the entire apparatus is removable from the insertion device on which it is installed, and can be transported to one or more additional insertion devices to perform measurements. According to this embodiment, no second first stage guide means or second first stage motor stator need be installed on the additional insertion devices.

In another embodiment, the apparatus comprises means for positioning the removable portion of the apparatus on a holding cart. In a specific embodiment, the means for positioning the removable portion of the apparatus is means for aligning the first stage carriage with the holding cart. In another specific embodiment, the means for positioning the removable portion of the apparatus is a mating guide socket on one of the two ends of the first stage guide means. A guide pin (e.g., diamond-shaped) mounted on the cart is aligned with the mating guide socket on the first stage guide means to enable a smooth transfer of the removable portion of the apparatus onto the holding cart. The removable portion of the apparatus can be driven, pushed, or rolled off the first stage guide means onto the holding cart.

Measurements can be taken with the apparatus of the invention in approximately eight hours, which represents significant time-savings, when compared with several weeks required for re-alignment of an insertion device when it is shipped off-site (e.g., to a commercial laboratory) for re-alignment. If the measurements taken indicate that the insertion device requires extensive re-alignment, the insertion device can be removed from the beam path for further work. Otherwise, if the re-alignment required is minor, the work can be performed on the insertion device without removing it a remote site.

Another benefit is the compactness of the apparatus of the invention. Mounting the first stage (Z-axis) guide means to the insertion device allows much better access to the magnet arrays. In existing measurement systems, the first stage (Z-axis) guide means is typically 20 inches wide—if an insertion device is positioned directly adjacent to the first stage guide means, it is in the way of the technician when shimming, or otherwise adjusting, the magnet arrays. If sufficient space is provided between the insertion device and the measurement system to allow unfettered access to the magnet arrays, then a large, cantilevered structure is required to hold the magnetic field strength sensor. This cantilever is liable to have very long settling times in response to acceleration, resulting in slow measurement rate and poor positional accuracy.

6. EXAMPLES

The following examples are offered by way of illustration and not by way of limitation.

FIG. 1 shows a schematic diagram of a set of X, Y, Z Hall probes (72). Each probe includes a printed circuit board (amplifier), 74, the output of which is sent electronically to a teslameter. 73, wires from Hall probe to printed circuit board (three pairs per Hall probe). 75, jacketed cable to teslameter. Dimensions of a typical set of Hall probes are indicated in inches.

FIG. 2 shows a schematic diagram of an embodiment of the apparatus of the invention. In this embodiment, the first-(Z-)stage guide means (13) is a granite guide rail. 1, first stage. 2, second stage. 3, third stage. 12, first (Z-)stage motor (stator). 13, first (Z-)stage guide means. 17, mating guide socket on first (Z-)stage guide means. 22, second (Y-)stage motor. 32, third (X-)stage motor. 40, frame of insertion device. 52, lower magnet assembly of insertion device. 62, magnetic field strength sensor. 63, sensor mount.

FIG. 3 shows a schematic diagram of a side view of the removable portion of a specific embodiment of the apparatus of the invention. In this embodiment, the first stage guide means (13) is a pair of non-magnetic stainless steel rails that are mounted on the frame of the insertion device (40) parallel to its long (Z-)axis. The first (Z-)stage, the second stage (in this embodiment a Y-stage), and the third stage (in this embodiment, an X-stage) are easily removable and slide off the steel guide rail onto a holding cart (also shown in FIGS. 5A–5B), for storage or for transporting to another insertion device for use in performing magnetic field measurements. In this embodiment, the first stage guide means and the stator of the first stage linear motor remain attached to the insertion device to which they are mounted. Any other insertion device on which the removable portions of the apparatus is subsequently mounted must therefore have a first stage guide means and first stage linear motor stator installed on it. 22, second (Y-)stage motor. 23, second (Y-)stage guide means. 26, slider portion of the second (Y-)stage motor. 32, third-(X-)stage motor. 33, third-(X-)stage guide means. 36, slider portion of the third (X-)stage motor. 62, magnetic field strength sensor. In this embodiment, the sensor has one or two Hall probes per X, Y and Z axis (i.e., a total of three or six probes).

FIG. 4 shows a schematic diagram of the front view of the removable portion of a specific embodiment of the apparatus of the invention. 11, first (Z-)stage carriage. 12, first (Z-)stage linear motor. 13, first (Z-)stage guide means, a steel rail. 18, Z-axis truck mount. 21, second (Y-)stage carriage. 22, second (Y-)stage motor. 24, nut on second (Y-)stage lead screw. 25, second (Y-)stage lead screw (drive mechanism). 28, Y-axis truck mount. 31, third (X-)stage carriage. 36, slider portion of third (X-)stage motor. 38, X-axis truck mount.

FIGS. 5A–5B. Front view (A) and side view (B) of a holding cart on which is mounted the removable portion of an embodiment of the apparatus of the invention. The removable portion of the apparatus (i.e., the first, second and third stages, with the exception of the stator of the first stage motor and the first stage guide means, which both remain attached to the insertion device), 108, is shown in FIGS. 3–4. In this embodiment, each of two 3-channel teslameters, 110 and 111, receives output from a set of XYZ magnetic field strength sensors. In another embodiment, three 2-channel teslameters could be used, with each teslameter receiving input from a pair of X-, Y-, or Z-axis sensors. 101, cart frame. 102, personal computer (PC). 103, PC hard drive. 104, PC CDROM drive. 105, floppy disk drive. 106, PC keyboard. 107, PC display. 109, holding beam of cart. 110, teslameter #1. 111, teslameter #2. 112, digital voltmeter (DVM) #1. 113, DVM #2. 114, DVM #3.

FIG. 6. A schematic diagram of a side view of a specific embodiment of the apparatus of the invention. In this embodiment, the first stage guide means is a granite rail and the first (Z-)stage carriage moves on vacuum-air bearings. Lower (19) and upper (20) vacuum-air bearings resting on the first (Z-)stage guide means (13) position the first (Z-)stage carriage (11) at a fixed position in the vertical or Y-axis. The magnetic attraction between the stator of the first (Z-)stage linear motor (12) and the first (Z-)stage carriage retains the carriage in the horizontal, or X-axis. 21, second (Y-)stage carriage. 22, second (Y-)stage motor. 31, third (X-)stage carriage. 32, third (X-)stage motor. 40, frame of insertion device. 52, lower magnet assembly of insertion device. 53, upper magnet assembly of insertion device. 62, magnetic field strength sensor.

FIG. 7. A schematic diagram of a front view of the specific embodiment of the apparatus of the invention shown in FIG. 6 in side view. 11, first (Z-)stage carriage. 12, first (Z-)stage linear motor. 13, first-(Z-)stage guide means (granite guide rail). 21, second (Y-)stage carriage. 23, second (Y-)stage guide means. 24, nut on second (Y-)stage lead screw. 25, second (Y-)stage lead screw (drive mechanism). 32, third (X-)stage motor. 52, lower magnet assembly of insertion device. 53, upper magnet assembly of insertion device. 61, head of position-sensing means (laser position encoder) on the first (Z-)stage.

FIG. 8 shows a schematic diagram of the control architecture of an embodiment of the apparatus of the invention. In this embodiment, the first stage position-sensing means is a laser position encoder.

In another specific embodiment, feedback about Z-axis position is provided by a laser position encoder with a 10-nm count resolution and quadrature output. Quadrature output is a common type of signal transmission for incremental encoders that is received and converted to counts by the servo controller, which maintains the position. Feedback for the X- and Y-axis positions is provided by the Renishaw tape scales and fed back to a servo controller. Servo controllers are well known in the art and commercially available, e.g., an AccroLoop 8202 4-axis controller (Mektron, Inc., Hawthorne, N.Y. 10532). This AccroLoop controller is particularly useful as it can accept feedback from either type of position sensor.

Two channels of the controller provide stepper control and two channels provide servo control. All four channels accept quadrature position feedback. The Hall probes are mounted so that X, Y and Z field directions are separated by a known Z dimension. Thus, when the probes are moved in the Z direction, a routine algorithm is applied to shift the data by the amount of the known offset, so that all three measurements can be referenced to the same point in space. The Hall probes send their data to an F.W. Bell Model 7030 teslameter (Sypris Test & Measurement, Orlando, Fla. Teslameter). This is a three-channel teslameter with three analog outputs, one each for of the X, Y and Z axes. The analog output tracks the Hall probe input with a latency of 20 KHz. This analog output is then sent electronically to a Keithley DVM (one for each axis), i.e., there is a separate DVM for each analog output. Each DVM is capable of sampling data and storing the sample based on a trigger input. The maximum response rate is 2 msec, but the actual latency between trigger and sample is much less than that.

As the first stage (Z-axis) carriage moves, the laser position encoder produces an incremental position output in quadrature. The servo controller receives this signal and produces 10 nm counts. The counts are summed by the servo controller and a trigger output is created every millimeter of travel. However, the trigger output has an error of ±100 μsec. This puts a ±1 μm error into the trigger position at a velocity of 10 mm/sec. The trigger signal is wrapped back into the servo controller card. High Speed Position Capture, a feature of the servo controller card, is then used. High Speed Position Capture is a trigger input with a latency of 100 μsec that can store the position from the laser position encoder at the point the trigger occurs. These data are stored in the servo controller and transferred at the end of a run to the information storage means (e.g., a personal computer) where the magnetic field samples taken by the DVMs will be corrected from theoretical trigger positions (1.000 mm) to actual trigger positions (e.g., 1.00201, 0.99998, etc). Then a plot of the actual data with actual positions is created.

The present invention is not to be limited in scope by the specific embodiments described herein. Indeed, various modifications of the invention in addition to those described herein will become apparent to those skilled in the art from the foregoing description. Such modifications are intended to fall within the scope of the appended claims.

All references cited herein are incorporated herein by reference in their entirety and for all purposes to the same extent as if each individual publication, patent or patent application was specifically and individually indicated to be incorporated by reference in its entirety for all purposes.

The citation of any publication is for its disclosure prior to the filing date and should not be construed as an admission that the present invention is not entitled to antedate such publication by virtue of prior invention.

What is claimed is:

1. An apparatus for measuring a magnetic field produced by an insertion device comprising:
   (a) a magnetic field strength sensor, wherein the sensor produces an output signal;
   (b) a first stage for positioning the sensor along a first axis of the insertion device, wherein:
      (i) the first stage comprises:
         (a) a first stage carriage,
         (b) first stage guide means comprising a first end and a second end,
         (c) a first stage motor,
         (d) a first stage drive mechanism, and
         (e) first stage position-sensing means, and
      (ii) the first stage guide means is mounted on the insertion device, wherein:
         (f) the axis of the first stage guide means is parallel with the first axis, and
         (g) the first axis is the long axis of the insertion device;
   (c) means for controlling position of the first stage;
   (d) a second stage for positioning the sensor along a second axis of the insertion device, wherein:
      (i) the second stage comprises:
         (a) a second stage carriage,
         (b) second stage guide means,
         (c) a second stage motor,
         (d) a second stage drive mechanism, and
         (e) second stage position-sensing means,
      (ii) the second axis is perpendicular to the first axis, and
      (iii) the second stage is mounted on the first stage;
   (e) means for controlling position of the second stage;
   (f) a third stage for positioning the sensor along a third axis of the insertion device, wherein:
      (i) the third stage comprises:
         (a) a third stage carriage,
         (b) third stage guide means,
         (c) a third stage motor,
         (d) a third stage drive mechanism, and
         (e) third stage position-sensing means,
      (ii) the third axis is perpendicular to the first axis and to the second axis;
      (iii) the third stage is mounted on the second stage, and
      (iv) the sensor is mounted on the third stage;
   (g) means for controlling position of the third stage; and
   (h) information storage means for reading the output signal from the sensor operably connected to the sensor.

2. The apparatus of claim 1 wherein:
   (i) the means for controlling position of the first stage,
   (ii) the means for controlling position of the second stage,
   (iii) the means for controlling position of the third stage, and
   (iv) the information storage means
   is a digital computer.

3. The apparatus of claim 1 wherein the first axis is parallel with the electron beam line within the insertion device.

4. The apparatus of claim 1 wherein the output signal is an analog signal.

5. The apparatus of claim 4 additionally comprising:
   (j) means for converting the analog signal to a digital signal operably connected to the sensor.

6. The apparatus of claim 4 additionally comprising:
   (k) means for amplifying the analog signal operably connected to the sensor.

7. The apparatus of claim 6 additionally comprising:
   (l) means for converting an amplified analog signal to a digital signal operably connected to the amplifying means.

8. The apparatus of claim 4 wherein the sensor comprises a Hall-effect probe.

9. The apparatus of claim 8 additionally comprising
   (m) means for amplifying the analog signal operably connected to the Hall-effect probe;
   (n) a teslameter operably connected to the amplifying means;
   (o) means for converting an amplified analog signal to a digital signal operably connected to the information storage means.

10. The apparatus of claim 1 wherein the output signal is a digital signal.

11. The apparatus of claim 1 wherein the first stage guide means is a granite guide rail.

12. The apparatus of claim 1 wherein the first stage guide means is a pair of steel guide rails.

13. The apparatus of claim 1 wherein a portion of the apparatus is removable.

14. The apparatus of claim 13 wherein the removable portion of the apparatus is the entire apparatus.

15. The apparatus of claim 13 wherein the first stage motor comprises a slider and a stator.

16. The apparatus of claim 15 wherein the removable portion of the apparatus comprises the third stage, the second stage, the first stage carriage, the slider of the first stage motor, the first stage drive mechanism and the first stage position-sensing means.

17. The apparatus of claim 13 additionally comprising means for positioning the removable portion of the apparatus on a holding cart.

18. The apparatus of claim 17 wherein the means for positioning the removable portion of the apparatus is a mating guide socket mounted on the first end of the first stage guide means.

19. A method for measuring magnetic fields produced by at least two insertion devices comprising:
   (1) installing on a first insertion device an apparatus for measuring a magnetic field produced by the insertion device wherein the apparatus comprises a removable portion and wherein the apparatus comprises:
      (a) a magnetic field strength sensor, wherein the sensor produces an output signal;

(b) a first stage for positioning the sensor along a first axis of the insertion device, wherein:
  (i) the first stage comprises:
    (a) a first stage carriage,
    (b) first stage guide means comprising a first end and a second end,
    (c) a first stage motor,
    (d) a first stage drive mechanism, and
    (e) first stage position-sensing means, and
  (ii) the first stage guide means is mounted on the insertion device, wherein:
    (f) the axis of the first stage guide means is parallel with the first axis, and
    (g) the first axis is the long axis of the insertion device;
(c) means for controlling position of the first stage;
(d) a second stage for positioning the sensor along a second axis of the insertion device, wherein:
  (i) the second stage comprises:
    (a) a second stage carriage,
    (b) second stage guide means,
    (c) a second stage motor,
    (d) a second stage drive mechanism, and
    (e) second stage position-sensing means,
  (ii) the second axis is perpendicular to the first axis, and
  (iii) the second stage is mounted on the first stage;
(e) means for controlling position of the second stage;
(f) a third stage for positioning the sensor along a third axis of the insertion device, wherein:
  (i) the third stage comprises:
    (a) a third stage carriage,
    (b) third stage guide means,
    (c) a third stage motor,
    (d) a third stage drive mechanism, and
    (e) third stage position-sensing means,
  (ii) the third axis is perpendicular to the first axis and to the second axis;
  (iii) the third stage is mounted on the second stage, and
  (iv) the sensor is mounted on the third stage;
(g) means for controlling position of the third stage; and
(h) information storage means for reading the output signal from the sensor operably connected to the sensor;
(2) measuring a magnetic field produced by the first insertion device with the apparatus;
(3) removing the removable portion of the apparatus from the first insertion device;
(4) installing the removable portion of the apparatus on a second insertion device; and
(5) measuring a magnetic field produced by the second insertion device with the apparatus installed on the second insertion device.

20. The method of claim 19 wherein the removable portion of the apparatus is the entire apparatus.

21. The method of claim 19 wherein the first stage motor comprises a slider and a stator.

22. The method of claim 21 wherein the removable portion of the apparatus comprises the third stage, the second stage, the first stage carriage, the slider of the first stage motor, the first stage drive mechanism and the first stage position-sensing means and wherein a second first stage guide means and a second first stage motor stator are installed on the second insertion device.

23. The method of claim 19 wherein the apparatus additionally comprises means for positioning the removable portion of the apparatus on a holding cart.

24. The method of claim 23 wherein the means for positioning the removable portion of the apparatus is a mating guide socket mounted on the first end of the first stage guide means.

* * * * *